United States Patent [19]
Lewis

[11] 4,159,435
[45] Jun. 26, 1979

[54] ACOUSTIC WAVE DEVICES EMPLOYING SURFACE SKIMMING BULK WAVES

[75] Inventor: Meirion F. Lewis, Malvern, England

[73] Assignee: The Secretary of State for Defence in Her Britannic Majesty's Government of the United Kingdom of Great Britain and Northern Ireland, London, England

[21] Appl. No.: 869,738

[22] Filed: Jan. 16, 1978

[30] Foreign Application Priority Data

Jan. 24, 1977 [GB] United Kingdom ............... 2750/77

[51] Int. Cl.² .................................. H01L 41/10
[52] U.S. Cl. ............................... 310/313; 310/360; 310/361; 333/154
[58] Field of Search .................. 310/313, 360, 361; 333/30 R

[56] References Cited

U.S. PATENT DOCUMENTS

| | | | |
|---|---|---|---|
| 3,680,009 | 7/1972 | Slobodnik, Jr. | 310/313 X |
| 3,886,484 | 5/1975 | Dias et al. | 310/313 X |
| 3,995,240 | 11/1976 | Kerbel | 310/313 X |

Primary Examiner—Mark O. Budd
Attorney, Agent, or Firm—Pollock, Vande Sande and Priddy

[57] ABSTRACT

An acoustic wave device employing surface skimming bulk waves comprises a piezo electric substrate having a flat surface which carries an input transducer and an output transducer for respectively launching and receiving acoustic waves into and from the bulk of the substrate. The substrate may be of quartz, lithium tantalate, or lithium niobate and has the flat surface orientated so that a surface skimming bulk wave is launched without generation of surface acoustic waves.

5 Claims, 3 Drawing Figures

ACOUSTIC WAVE DEVICES EMPLOYING SURFACE SKIMMING BULK WAVES

This invention relates to acoustic wave devices in which acoustic waves are caused to travel in the bulk of a substrate between two transducers.

In U.K. Patent specification Number 1,451,326, corresponding to U.S. Pat. No. 3,950,713, an oscillator is described which comprises an acoustic wave delay line in the feedback loop of an amplifier. This delay line comprises a piezo electric substrate carrying two interdigital comb transducers which can launch and receive surface acoustic waves along or in the surface between the transducers. Alternatively, when using quartz slices orientated at right angles to the AT-cut plane and to the YZ-plane the delay line can operate using bulk acoustic waves i.e., waves travelling beneath the substrate surface. This gives insensitivity to surface contamination.

According to this invention an acoustic wave device comprises a piezo electric substrate having a flat surface which carries at least two transducers for launching and receiving acoustic waves into and from the bulk of the substrate between the two transducers, the piezo electric substrate having an orientation as hereinafter defined.

The orientation of the flat surface of the substrate according to this invention is:- a rotated Y-cut quartz (rotated about the X axis) with the transducers arranged to propagate acoustic waves perpendicular to the X axis, the rotation about the X axis being in the range −60° to −45° preferably −55° to −48°, and also the range 30° to 45°; a rotated (about X axis) Y-cut LiTaO$_3$, the rotation being in the range 36°±3° and −54°±3° and propagation along the X axis; rotated (about Y axis) Y-cut LiNiO$_3$, the rotation being in the range 45°±5° and −45°±5° and propagation along the X axis.

Preferably the transducers are interdigital comb transducers.

Transducers may launch a number of types of bulk acoustic waves into a substrate; this is discussed in 1977 Ultrasonics Symposium Proc, papers T1, T2 articles Surface Skimming Bulk Waves, SSBW by M. F. Lewis, and Bandpass Filters Employing Surface Skimming Bulk Waves by T. I. Browning, D. J. Gunton, M. F. Lewis, and C. O. Newton. One type of bulk acoustic wave travels at and below the surface approximately parallel thereto; it is has been termed a surface skimming bulk wave (SSBW) and is a horizontally polarized shear wave. Another SSBW is a longitudinal wave.

The following properties are desirable or necessary for a surface skimming bulk wave device:
1. No surface acoustic wave coupling;
2. Shear wave or quasi shear wave polarized in the plane of the surface; this is necessary to prevent leakage of energy into the volume of the substrate;
3. A good k$^2$ for the bulk waves 2. above with a small coupling to other bulk waves;
4. Zero temperature co-efficient for bulk waves;
5. Beam stearing or focussing properties.

One class of cuts satisfying 1, 2, 5 is the rotated Y-cuts of quartz (i.e., rotated about X axis) with propagation perpendicular to the X axis. This whole class has k$^2$=0 for surface acoustic waves. It has a shear wave polarized in the X direction i.e., in the plane, which is necessary for the wave to propagate without serious leakage of energy into the substrate. Also within the class, two ranges of angles of rotation of the Y-cut satisfy condition 4. These ranges are −48° to −55° rotated Y cut which supports a shear wave with velocity about 3.3×10$^5$ cm/sec (closely analogous to the shear wave used in the normal AT cut bulk wave oscillator) and also the range 30° to 40° which supports a shear wave with velocity about 5.1×10$^5$ cm/sec (and closely analogous to the shear wave used in the normal BT cut bulk wave oscillator). Acoustic wave devices exhibit a frequency change with substrate temperature change thereby limiting the usefulness of some devices. These rotated Y cut quartz show a zero temperature co-efficient, i.e., a zero frequency change with changing substrate temperature, at a temperature value or range which is dependent on the angle of rotation. For example zero temperature coefficient for a number of quartz cuts occur as follows:

| Rotation degree | Temperature °C. |
| --- | --- |
| −49 | −30 |
| −49.5 | −10 |
| −50 | +10 |
| −50.5 | +40 |
| −50.5 to −51 | Over 60 extending for a range of temperatures |
| 35 | −10 |
| 35.3 | +15 |
| 36 | 30 |
| 36.5 | 50 |
| 37 | 70 |

The particular delay structure used to obtain the above results had an acoustic path 2,500 λ long and a transducer length of 2,500 λ with periodically thinned (missing) finger pairs, λ being wavelength. Different transducer structures modify the above values. For rotated Y cuts in the above ranges with propagation perpendicular to the X axis, the acoustic propagation is symmetrical about the propagation direction so that the energy travels parallel to the k vector (i.e., no beam steering) and this also makes for insensitivity to small misorientations in manufacture.

The class of cut with a shear wave velocity of 5.1×10$^5$ cm/sec is particularly attractive for high frequency oscillators. One has been made which showed a parabolic frequency temperature variation (a 35.3° rotated Y cut) with inversion temperature at 20° C., measured on an oscillator having a delay line of path length 2,500 λ wavelengths.

The invention will now be described by way of example only with reference to the accompanying drawings in which.

Figure 1:
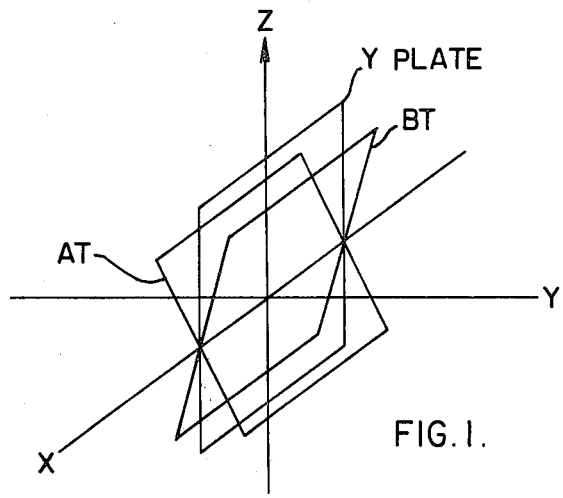
FIG. 1 shows some planes of cuts in quartz.

The three orthogonal axes of a crystal are shown in FIG. 1. A Y-cut plate is one whose operating surface lies in the Z, X plane. If the plane is rotated by 35.3° about the X axis it is termed an AT-cut. Another cut is termed the BT-cut. Yet another is the ST-cut. The cuts used for bulk waves of this invention are about perpendicular to the AT-cut and BT-cut since the bulk waves are propagated approximately parallel to the flat surface and not across a thickness of a thin plate as in conventional bulk wave devices.

Figure 2:
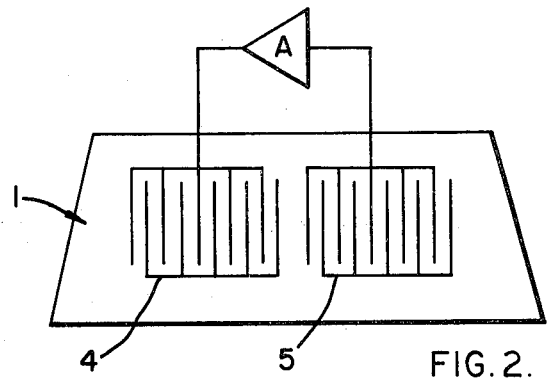
FIG. 2 shows a plan view of a bulk acoustic wave device connected to an amplifier to form an oscillator.
Figure 3:
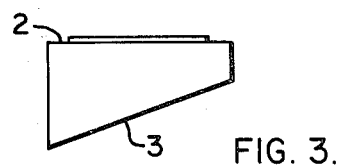
FIG. 3 shows an end view of FIG. 2.

As shown in FIGS. 2, 3 a delay line comprises a quartz substrate 1 with a flat upper surface 2 orientated as hereinbefore defined. The bottom surface 3 is preferably angled by a few degrees and roughened to prevent reflections interfering with the wanted bulk waves. Two interdigital transducers 4, 5 are mounted on the flat surface 2. As an example the transducers may each have 90 finger pairs and be separated (center to centre) by a distance almost equal to the transducer length to give mode suppression as taught in U.K. Pat. No. 1,451,326. An amplifier 6 is connected between the transducers 4, 5. The whole device may be encapsulated within a plastics material.

In operation surface skimming bulk acoustic waves are launched by transducer 4 into the substrate. These SSBW travel beneath the surface 2 and are transduced back into electrical signals by transducer 5. Since the transducers 4, 5 are close together good coupling into and from the substrate occurs. However other transducer configurations are possible, for example ladder types as taught in the aforementioned U.K. Pat. No. 1,451,326.

The invention is not limited to oscillators but can be used in place of surface acoustic wave delay lines in many filter applications.

Substrates other that quartz may be used for example LiNbO$_3$ and LiTaO$_3$ but the cuts used must be orientated to give properties listed at 1 to 5 above. For LiTaO$_3$ these include approximately $+36°\pm3°$ and $-54°\pm3°$ (orthogonal) rotated (about X-axis) Y-cuts containing the directions of polarization of the shear bulk waves which propagate along the X-axis of the crystal (as calculated for an infinite medium). The acoustic wave propagation is in the X-direction. For LiNbO$_3$ the cuts are $45°\pm5°$ and $-45°\pm5°$ rotated Y cuts, propagation is in the X direction.

It should be understood that this list of properties can be departed from slightly since they are ideal, e.g. a small amount of surface wave coupling can be tolerated (and removed by surface mounted absorbers) but it is preferably as low as possible.

I claim:

1. An acoustic wave device employing surface skimming bulk waves, comprising a piezo electric substrate having a flat surface and an input transducer and an output transducer mounted on said flat surface for respectively launching acoustic waves in and receiving acoustic waves from the substrate, the substrate having an orientation of said flat surface which is a rotated, about the crystalline X axis, Y cut material, said substrate and its associated transducers being selected from one of the following groups:
    (a) a quartz substrate with the rotation of cut about the X axis being in the ranges $-60°$ to $-45°$ and $30°$ to $40°$, and with said transducers being so arranged on said surface that propagation of the acoustic wave vector is perpendicular to the X axis; and
    (b) a lithium tantalate substrate with the rotation of cut about the X axis being in the ranges $33°$ to $39°$ and $-51°$ to $-57°$, and with said transducers being so arranged on said surface that propagation of the acoustic wave vector is parallel to the X axis.

2. A device according to claim 1 wherein the substrate is quartz and the rotation of cut is in the range $-55°$ to $-48°$ inclusive.

3. A device according to claim 1 wherein the substrate is quartz and the rotation of cut is in the range $-51°$ to $-49°$ inclusive.

4. A device according to claim 1 wherein the substrate has a face opposite said flat surface which is not parallel to said flat surface.

5. A device according to claim 1 wherein the transducers are interdigital finger comb transducers.

* * * * *